United States Patent
Kholodenko et al.

[11] Patent Number: 5,942,039
[45] Date of Patent: Aug. 24, 1999

[54] SELF-CLEANING FOCUS RING

[75] Inventors: Arnold Kholodenko, San Francisco; Steve S.Y. Mak, Pleasanton, both of Calif.

[73] Assignee: Applied Materials, Inc., Santa Clara, Calif.

[21] Appl. No.: 08/847,012

[22] Filed: May 1, 1997

[51] Int. Cl.⁶ .............................. C23C 16/00; C23F 1/02
[52] U.S. Cl. ................ 118/723 E; 156/345; 118/723 R; 118/723 I; 118/723 MP
[58] Field of Search ........................ 156/345; 118/723 R, 118/723 E, 723 I, 723 MW, 723 MP

[56] References Cited

U.S. PATENT DOCUMENTS

| | | | |
|---|---|---|---|
| 4,645,218 | 2/1987 | Ooshio et al. | 279/1 M |
| 4,869,801 | 9/1989 | Helms | 204/298 |
| 5,203,981 | 4/1993 | Akazawa | 204/298.15 |
| 5,213,658 | 5/1993 | Ishida | 156/643 |
| 5,228,501 | 7/1993 | Tepman et al. | 165/80.1 |
| 5,246,532 | 9/1993 | Ishida | 156/345 |
| 5,275,683 | 1/1994 | Arami et al. | 156/345 |
| 5,298,465 | 3/1994 | Levy | 437/225 |
| 5,330,607 | 7/1994 | Norwicki | 156/345 |
| 5,352,294 | 10/1994 | White et al. | 118/725 |
| 5,376,213 | 12/1994 | Ueda et al. | 156/345 |
| 5,411,624 | 5/1995 | Hirano et al. | 156/345 |
| 5,423,918 | 6/1995 | Gupta et al. | 134/1 |
| 5,529,657 | 6/1996 | Ishii | 156/345 |
| 5,595,627 | 1/1997 | Inazawa et al. | 156/643.1 |
| 5,622,593 | 4/1997 | Arasawa et al. | 156/345 |
| 5,683,537 | 11/1997 | Ishii | 156/345 |
| 5,685,914 | 11/1997 | Hills et al. | 118/723 E |
| 5,685,942 | 11/1997 | Ishii | 156/345 |
| 5,688,358 | 11/1997 | Tanaka et al. | 156/345 |
| 5,695,564 | 12/1997 | Imahashi | 118/719 |
| 5,695,566 | 12/1997 | Suzuki et al. | 118/723 E |
| 5,698,062 | 12/1997 | Sakamoto et al. | 156/345 |
| 5,817,534 | 10/1998 | Ye et al. | 438/10 |
| 5,868,848 | 2/1999 | Tsukamoto | 118/723 E |

*Primary Examiner*—Robert Kunemund
*Assistant Examiner*—Jeffrie R Lund
*Attorney, Agent, or Firm*—Ashok Janah

[57] ABSTRACT

An electrically activated focus ring (90) for plasma processing a substrate (25) in a plasma zone comprises a dielectric barrier (92) with a plasma focusing surface (95) for focusing the plasma onto the substrate surface, and an opposing surface (98). The focus ring (90) comprises an electrical conductor element (100) abutting at least a portion of the opposing surface (98) of the dielectric barrier (92). The conductor element (100) is electrically isolated from the plasma and capable of being electrically charged to attract the plasma to reduce formation of deposits on the plasma focusing surface (95) of the dielectric barrier (92).

17 Claims, 3 Drawing Sheets

SELF-CLEANING FOCUS RING

BACKGROUND

This invention relates to a focus ring useful for focusing plasma in a plasma processing apparatus.

In semiconductor fabrication, process gases are used to deposit material upon, etch, or clean semiconductor substrates. These processes are typically carried out in an enclosed process chamber having gas distributors for distributing process gas therein. One problem with conventional process chambers is the inability to achieve a uniform distribution or concentration of reactive process gas species across the substrate surface, particularly at the perimeter of the substrate. The non-uniform distribution of reactive process gas species results in non-uniform and variable processing rates across the substrate surface. A more uniform reactive species distribution across the substrate is obtained using process gas flow containment structures to direct the flow of process gas onto the substrate. For example in plasma processing, it is known to use a plasma focus ring around the substrate to maintain a more uniform distribution of the reactive process gas species across the substrate.

Conventional plasma and process gas focus rings typically comprise a wall surrounding the substrate for directing the flow of process gas or plasma on the surface of the substrate. One problem with such focus rings arises from the deposition of contaminant polymeric and other process byproduct deposits on the walls of the focus rings, and in particular the inner wall facing the substrate. The contaminant particles also deposit on the interior walls and other process components of the chamber. The contaminant deposits are formed from the decomposition and/or chemical recombination of chemical species in the process gas plasma, for example, polymeric materials comprising carbon, nitrogen, and hydrogen species. These deposits flake off and produce particulates that contaminate the substrate during processing or manipulation of the substrate. It is difficult to non-destructively detect contamination of the substrates during processing, and it is only in the final processing stages that the contaminants are discovered, and the entire substrate is rejected. Thus, the focus ring, interior of the chamber, and other processing components must be regularly cleaned thereby reducing overall process efficiency. Also, many of these cleaning processes are performed using corrosive gases, such as $NF_3$ plasmas, which erode the processing components and limit the life of the process chamber.

In another solution for reducing particulate contamination involves a final processing step of raising the focus ring above the substrate and flowing inert gas in the chamber to flush out the contaminant particulates accumulated in this region, as for example, disclosed in commonly assigned U.S. Pat. No. 5,423,918. However, mechanical stresses resulting from raising and lowering the focus ring can dislodge the contaminant deposits formed on the focus ring to form additional contaminant particulates in the chamber. Also, the steps of raising and lowering the focus ring increase process time and further reduce efficiency.

Thus, there is a need for a processing apparatus capable of providing a substantially uniform concentration of reactive process gas across the substrate surface, and in particular, at the perimeter of the substrate. There is also a need for an apparatus and method that reduces formation or deposition, of contaminant particulate deposits on the chamber walls and processing components.

SUMMARY

The present invention provides an apparatus for providing a substantially uniform concentration of reactive process gas across the substrate surface, and capable of reducing formation of particulate contaminants in the chamber. In one embodiment, the present invention comprises a process chamber for processing a substrate in a plasma. A support is used to support the substrate which has a surface with a perimeter. A gas distributor is used to distribute process gas in the chamber, and a plasma generator forms a plasma from the process gas. A composite focus ring around the substrate comprises (i) a dielectric barrier having a plasma focusing surface for focusing plasma onto the substrate surface, and (ii) an electrical conductor element electrically coupled to the dielectric barrier, the conductor element being electrically isolated from the plasma and capable of being electrically charged to attract plasma ions toward the dielectric barrier to reduce formation of deposits on the plasma focusing surface of the dielectric barrier.

In another embodiment, the present invention provides an electrically activated self-cleaning focus ring for processing a substrate in a plasma. The focus ring comprises a dielectric barrier having a plasma focusing surface shaped and sized to be positioned contiguous to the perimeter of the substrate to focus the plasma onto the substrate surface, and an opposing surface. An electrical conductor element abutting at least a portion of the opposing surface of the dielectric barrier is electrically isolated from the plasma and capable of being electrically charged to attract plasma ions toward the dielectric barrier to reduce formation of deposits on the plasma focusing surface of the dielectric barrier.

A plasma processing method, according to the present invention, for reducing deposits on a dielectric focus ring around surrounding a substrate in a plasma zone. The method comprises the steps of placing a substrate on a support in the plasma zone, introducing process gas into the plasma zone, and generating a plasma from the process gas. The plasma is focused on the substrate using a plasma focusing surface of the dielectric focus ring. A conductor element abutting the dielectric focus ring and electrically isolated from the plasma, is electrically charged so that the plasma is attracted toward and impinges upon the dielectric focus ring to remove the contaminant deposits formed thereon.

DRAWINGS

These and other features, aspects, and advantages of the present invention will become better understood with regard to the following description, appended claims, and accompanying drawings which illustrate examples of the invention, where:

DESCRIPTION

Figure 1:
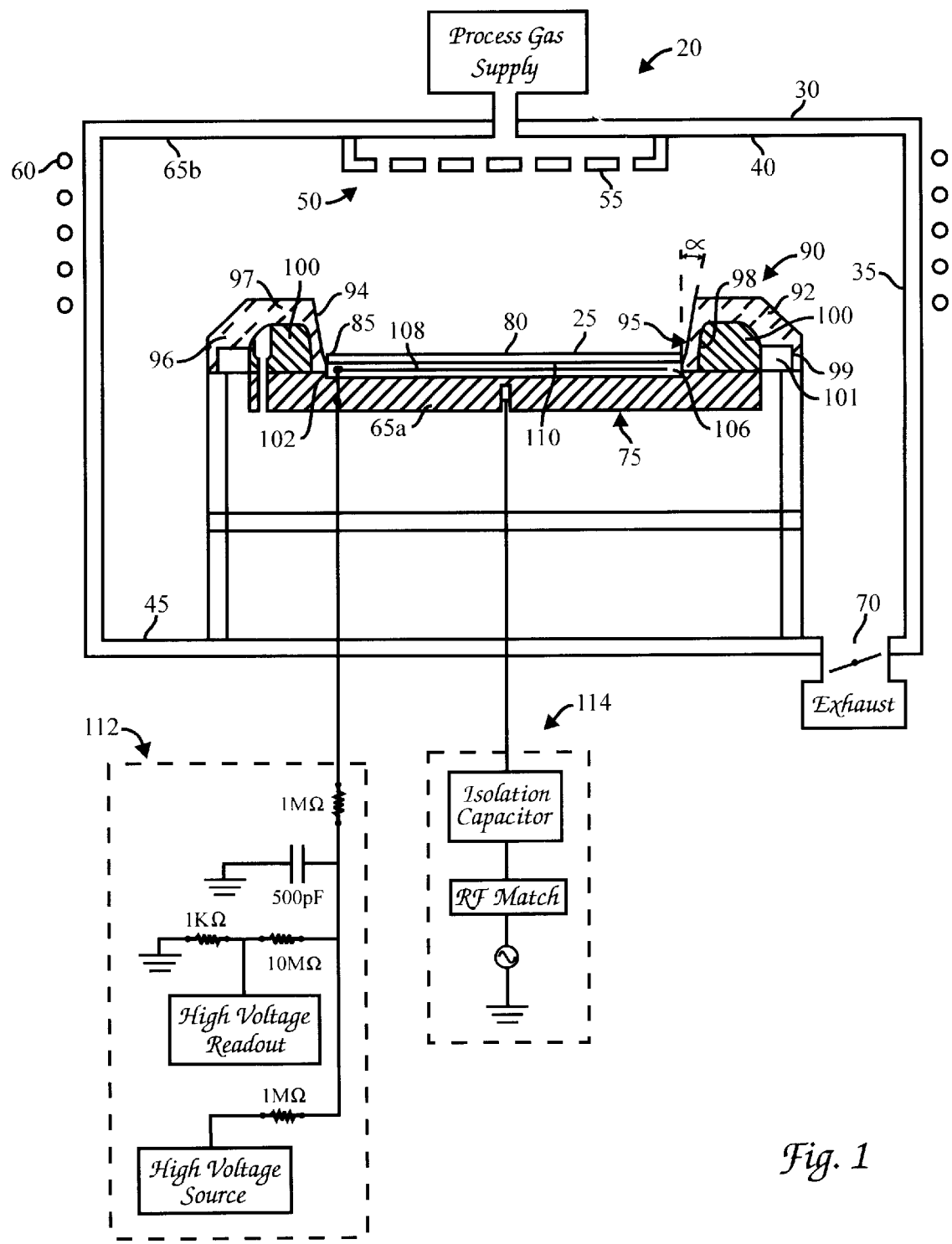
FIG. 1 is a partial sectional schematic view of an embodiment of an apparatus according to the present invention.

The present invention provides an apparatus and method for uniformly processing a substrate in process gas using a gas focus ring, that is also capable of reducing formation of contaminant deposits on the focus ring. The apparatus can be used to deposit material on the substrate, such as by chemical vapor deposition or sputtering processes; implant material in the substrate, such as by ion implantation processes; and etch the substrate, such as by plasma etching or reactive ion etching processes. A schematic of an exemplary processing apparatus 20 of the present invention, suitable for processing a semiconductor substrate 25 is shown in FIG. 1. The particular embodiment of the apparatus 20 shown herein is provided only to illustrate operation of the invention and should not be used to limit the scope of the invention. For example, the apparatus 20 can be used for non-plasma processes as described above and can also be used for manufacturing processes other than semiconductor fabrication.

The apparatus 20 generally comprises an enclosed process chamber 30 having sidewalls 35, a top ceiling wall 40, and a bottom wall 45. Process gas is introduced into the chamber 30 through a gas distributor 50 having a perforated "showerhead" gas diffuser 55 to distribute the process gas in the chamber 30. The process gas can be inductively coupled to form a plasma using an inductor coil 60 wound around the chamber 30, or capacitively coupled by process electrodes 65a, 65b in the chamber. In the example shown, one of the process electrodes 65a is located below the substrate 25, and the other process electrode 65b is formed by electrically grounding the walls of the process chamber 30. Combined inductive and capacitive coupling can also be used to form a more uniform or directed plasma in the chamber 30. An exhaust manifold 70 is provided for withdrawing spent process gas and process gas byproducts from the chamber 30. A substrate support 75 is provided to hold the substrate 25 which has a surface 80 and a perimeter 85.

Figure 2:
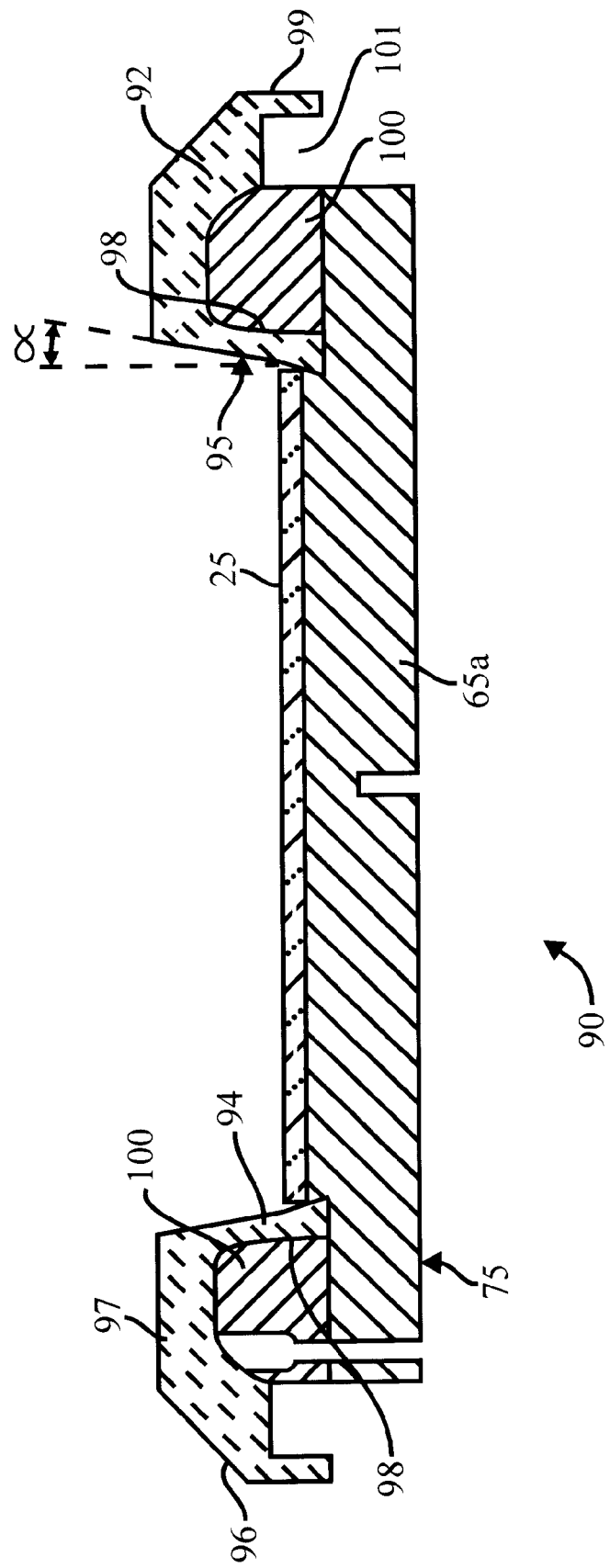
FIG. 2 is a sectional schematic view of an embodiment of the composite focus ring of the present invention.

A composite, electrically activated, self-cleaning focus ring 90 is positioned around the substrate 25. The focus ring 90 can form a free-standing dielectric structure resting on the substrate support 75, or a dielectric structure attached to and extending from the sidewall 35 of the process chamber 30. Referring to FIGS. 1 and 2, the focus ring 90 comprises a dielectric barrier 92 shaped and sized to be positioned around the perimeter 80 of the substrate 25 for containing and directing the flow of process gas or plasma to the substrate 25. The inner diameter of the dielectric barrier 92 is sized sufficiently large to encircle the perimeter of the substrate 25. For example, for substrates having a diameter of 200 mm (about 8-inch), a suitable inner diameter is from about 201 mm to about 210 mm, and more preferably from about 201 mm to about 205 mm. The height of the dielectric barrier 92 for a 6-to-12 inch diameter substrate is preferably from about 15 mm to about 25 mm.

Preferably, the dielectric barrier 92 has a plasma (or process gas) focusing surface 95 abutting and extending substantially continuously along the perimeter 85 of the substrate 25 for focusing the plasma onto the substrate surface 80, and an opposing surface 98 on the other side of the barrier 92. Preferably, the plasma focusing surface 95 of the dielectric barrier 92 forms an inverted conical surface extending above and surrounding the substrate surface to direct process gas to the substrate 25 substantially without interfering with or blocking the flow of the process gas. More preferably, the plasm focusing surface forms a plane having an angle α to a vertical axis which is perpendicular to the plane of the substrate 25, the angle α being sufficiently large to capture a large number of plasma species in the chamber. Preferably, the angle α is from about 10° to about 75°, and more preferably from about 15° to about 40°, and most preferably about 35°.

The focus ring 90 comprises an electrical conductor element 100 electrically coupled to the dielectric barrier 92 and abutting at least a portion of the dielectric barrier. The conductor element 100 is electrically isolated from the plasma and is capable of being electrically charged to attract plasma ions to sputter-off deposits from the dielectric barrier 92, during processing of the substrate 25 to provide a self-cleaning focus ring. The conductor element 100 is electrically isolated from the plasma in the process chamber 30 to prevent electric discharge and shorts between the plasma and the conductor element 100. The electrical isolation can be achieved using any dielectric material or layer covering the conductor element. The resistivity of the dielectric material is also sufficiently high to electrically isolate the conductor element 100 from the plasma and prevent discharge between the plasma and the conductor element 100, and sufficiently low to allow coupling of the electric field from the charged conductor element 100 through the dielectric barrier 92 to form an electric field emanating from the dielectric barrier. Thus, the dielectric material can be an insulator or a partially conducting material that provides these electrical isolation and electric field penetration criteria. Preferably, the dielectric barrier material covering the conductor element 100 comprises a dielectric material having a resistivity of from about $1\times10^8$ Ωcm to about $1\times10^{20}$ Ωcm. More preferably, the dielectric material comprises a resistivity of from about $10^{11}$ Ωcm to about $10^{20}$ Ωcm, and a dielectric constant of at least about 2. Preferably, the dielectric material comprises a dielectric breakdown strength is at least about 100 volts/mil, and more typically from 1000 to 10,000 volts/mil. A suitable thickness of the dielectric material (or dielectric barrier) is at least about 10 microns, and more preferably from about 10 to about 500 μm.

Suitable dielectric materials include $Al_2O_3$, BeO, $SiO_2$, $Ta_2O_5$, $ZrO_2$, CaO, MgO, $TiO_2$, $BaTiO_3$, AlN, TiN, BN, $Si_3N_4$, $ZrB_2$, $TiB_2$, $VB_2$, $W_2B_3$, $LaB_6$, $MoSi_2$, $WSi_x$, or $TiSi_x$. A preferred dielectric material is $Al_2O_3$ which provides excellent chemical and erosion resistance in erosive environments, and high temperature resistance exceeding 2000° C. The dielectric barrier material can also be doped with suitable dopants to provide the desired electrical properties, such as electrical resistivity or dielectric breakdown strength. For example, whereas pure alumina has a resistivity on the order of $1\times10^{14}$Ωcm, alumina can be doped with 1 to 3 wt % titania to provide a lower resistivity on the order of $1\times10^{11}$ to $1\times10^{13}$ Ωcm.

In a preferred embodiment, the dielectric barrier 92 is shaped to cover and electrically isolate the conductor element 100 from the plasma. In the embodiments shown in FIGS. 1 and 2, the dielectric barrier 92 comprises a U-shaped collar of dielectric material entirely covering the upper surfaces of the conductor element 100 to electrically isolate the same. The U-shaped collar comprises an (i) inner wall 94 having the plasma focusing surface 95 that surrounds and faces the substrate 25, (ii) an outer wall 96 that at least partially covers and enclose the conductor element 100 therein, and (iii) a middle transverse bridging wall 97 extending around and above the conductor element 100 from the inner wall 94 to the outer wall 96.

Preferably, the outer wall 96 comprises an outer lip 99 having a peripheral edge that mates with a corresponding metal ridge 101 in the support 75 to ensure proper alignment of the dielectric barrier on the support.

Preferably, the conductor element 100 abuts and extends continuously around the substrate 25 to uniformly attract plasma ions to the entire plasma focusing surface 95 of the dielectric barrier. This allows the plasma ions to energetically impinge upon and remove deposits from substantially the entire surface of plasma focusing surface 95. For example, the conductor element 100 can be an annular collar ring having an inner circumferential diameter sized larger than the diameter of the substrate. The outer diameter of the conductor element should be sized small enough to fit within the shape of the U-shaped collar of the dielectric barrier 92. The conductor element 100 can be fabricated as a continuous ring or an assembly of a plurality of metal segments that are shaped and sized to surround substantially the entire perimeter of the substrate. The metal segments can be electrically connected to one another such that the entire assembly is electrically charged using a single charging supply or connector terminal.

The diameter and shape of the inner surface of the conductor element 100 is selected so that the inner surface of the conductor element intimately contacts the outer surface 98 of the dielectric barrier 92.

Preferably, the inner surface 98 of the dielectric barrier 92 is mated to the shape of the conductor element 100 to provide uniform electric field coupling between the conductor element 100 and the dielectric barrier 92. Rough, non-uniform, sections of the dielectric barrier and the conductor element 100 where the surfaces do not uniformly or smoothly contact one another, form electrically insulative gaps and barriers. Thus, preferably, the abutting surface of the conductor element 100 and the opposing surface 98 of the dielectric barrier are uniformly polished to provide a coupling interface having smooth surfaces with an RMS roughness of less than about 50 and more preferably less than 35. The smooth coupling interface surfaces reduce electric field perturbations, and provides more uniform coupling between the conductor element and the electrode 65b, to provide a more uniform electric field flux emanating from the dielectric barrier 92. For substrates having a diameter of 200 mm (about 8-inch), a suitable diameter of the inner surface is from about 201 mm to about 250 mm, and more preferably from about 201 mm to about 225 mm. The height of the conductor element 100 for 6 to 12 inch diameter substrates is from about 10 mm to about 25 mm.

During operation, the process electrodes 65a and 65b are electrically biased with respect to one another to generate an electric field for forming the plasma in the process chamber 30 and attracting plasma ions towards the substrate surface 80. The conductor element 100 is electrically connected to electrode 65a it is electrically biased with respect to process electrode 65b. Capacitive coupling between the conductive element 100 and the electrode 65b generates an electric field emanating from the dielectric covering on the conductor element 100 causing plasma ions to be attracted toward the plasma focusing surface 95. As such, the electric field between electrodes 65a and 65b is extended to include the conductor element 100, and the plasma ions energetically impinging upon and sputtering off deposits from the dielectric barrier.

The energetically impinging plasma ions also heats the plasma focusing surface 95 of the dielectric barrier 92 to temperatures sufficiently high to reduce deposition of the volatile polymeric deposits on the barrier surfaces. Typically the surface 95 is heated to temperatures of from about 100° C. to 400° C., and more typically 200° C. to 375° C. At these temperatures, the volatile polymeric deposits vaporize and are exhausted from the chamber. The impingement energy and temperature are proportional to the electric field energy transmitted through the barrier which is proportional to the voltage or charge applied to the conductor element and degree of electric coupling between the conductor element 100 and the barrier 92. By these methods, the composite focus ring of the present invention prevents the deposition of contaminants on focus ring, thereby increasing substrate yields, and reducing requirements to clean the chamber.

Referring to FIG. 1, the support 75 can include an electrostatic chuck 102 for securing the substrate 25 on the support 75. The chuck 102 can include an electrostatic member having an insulator 106 with an electrode 108 therein, the insulator 106 having an upper surface 110 for receiving the substrate 25 thereon. The electrode 108 is electrically connected to a first voltage supply 112 for operating the chuck. The first voltage supply 112 typically includes a circuit which comprises a high voltage DC source of about 1000 to 3500 volts, connected to a high voltage readout, through a 10 MΩ resistor. A 1 MΩ resistor in the circuit limits current flowing through the circuit, and a 500 pF capacitor is provided as an alternating current filter. Bipolar chucks (not shown) can also be used to secure the substrate 25 on the support 75. In these chucks, two or more bipolar electrodes are disposed within the insulator 106 and the first voltage supply 112 powering the bipolar electrodes in the chuck 20 comprises a first DC power source and a second DC power source. The first and second DC power sources provide negative and positive voltages to the bipolar electrodes to maintain the electrodes at negative and positive electric potentials relative to one another. The opposing electric potentials of the bipolar electrodes induce opposing electrostatic charges in the bipolar electrodes and in the substrate 25 held to the chuck 102 without use of the plasma in the process chamber 30, causing the substrate to be electrostatically held to the chuck 102. Bipolar electrode configurations are advantageous for non-plasma processes in which there are no charged plasma species to serve as charge carriers for electrically biasing the substrate.

At least a portion of the support 75 is electrically conductive and functions as the process electrode 65a, or cathode, for forming the plasma in the process chamber 30. The grounded walls of the process chamber 30 form the process electrode 65b, and a second voltage supply 114 is connected to the electrically conductive portion of the support 75 to electrically bias the support 75 with respect to the grounded walls of the process chamber 30 to form the plasma from the process gas. The second voltage supply 114 generally comprises an RF impedance that matches the impedance of the process chamber 30 to the impedance of the line voltage, in series with an isolation capacitor. The conductor element 100 electrically contacts the electrically conducting portion of the support 75 so that the electrical charge applied to the support 75 is conducted to the conductor element 100.

In another embodiment, the dielectric barrier 92 comprises a layer of dielectric material covering the conductor element 100 to electrically insulate the conductor element 100. In this embodiment, the conductor element 100 is an annular ring covered by the dielectric layer and resting on the support 75. The resistivity and thickness of the dielectric layer are sufficiently high to electrically isolate the conductor element 100 from the plasma and prevent discharge between the plasma and the conductor element 100, and sufficiently low to allow penetration of an electric field from the charged conductive element 100 through the dielectric layer to attract plasma ions to the plasma focusing surface 95 of the dielectric barrier 92. The dielectric layer should have a sufficiently high dielectric breakdown strength to prevent leakage of plasma charge between the electrically biased conductive element 100 and the plasma in the process chamber 30. Preferably, the dielectric breakdown strength of the dielectric layer is at least about 4 volts/micron, and more preferably at least about 40 volts/micron. The thickness of the dielectric barrier 92 depends on its dielectric breakdown strength and dielectric constant. Typically, the dielectric constant of the dielectric layer is from about 2 to 5, and more preferably at least about 3. For a dielectric barrier having a dielectric constant of 3.5, a suitable thickness is from about 100 µm to about 1000 µm.

Figure 3:
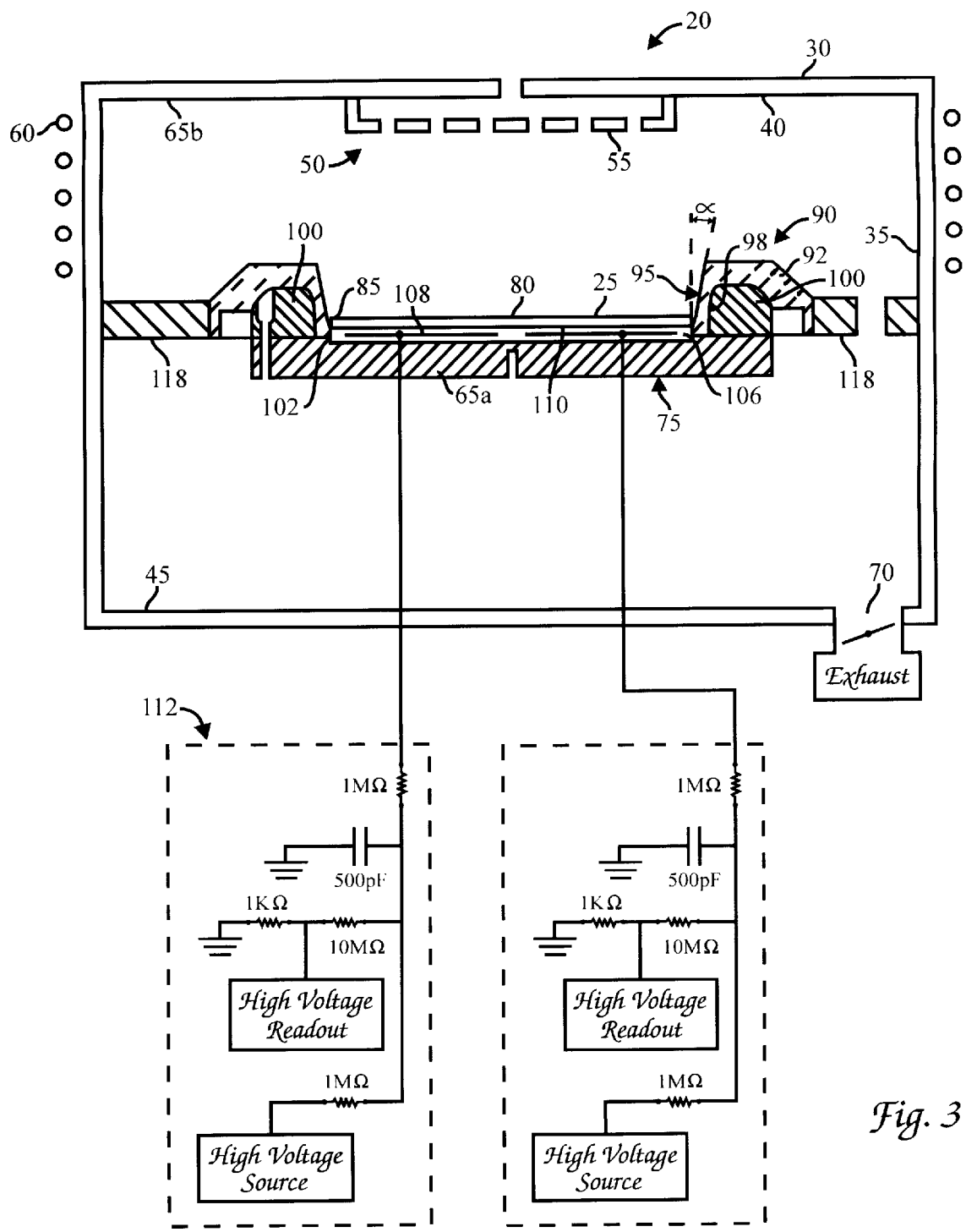
FIG. 3 is a partial cross-sectional schematic view of another embodiment of an apparatus according to the present invention.

In the embodiment shown in FIG. 3, the focus ring 90 is attached to the process chamber 30. For example, an arm 118 could be used to hold the focus ring to the wall of the chamber (as shown), or the focus ring 90 could form an integral extension of the wall of the chamber (not shown). One end of the arm 118 is attached to the side wall 35 of the process chamber 30 and the other end of the arm 118 is attached to the focus ring 90. The arm 118 can be a conductor such as aluminum, in which case, the arm 118 is electrically isolated from the focus ring 90 at the point of its interface with the focus ring 90, and in particular, from the conductor element 100. The arm 118 is useful when the focus ring 90 is rigid, and the support 75 is movable from a first lower position suitable for loading the substrate 25 on the support 75 to a second higher position suitable for processing the substrate 25. In the second higher position the conductor element 100 is in electrical contact with the conductive portion of the support 75 to allow conduction of charge from the support 75 to the conductor element 100.

The present invention also provides a plasma processing method for reducing deposit formation on the focus ring 90 surrounding the substrate 25 in the process chamber 30. The process chamber 30 is evacuated and maintained at a pre-determined sub-atmospheric pressure. The substrate 25 is placed on the chuck 102 which is electrically biased with respect to the substrate 25 by the first voltage supply 112. Thereafter, the process gas is introduced into the chamber 30 via the gas distributor 55, and plasma is formed from the process gas by activating the second voltage supply 114. The voltage applied to the electrode 108 causes electrostatic charge to accumulate in the electrode 108 and the plasma in the chamber 30 provides electrically charged species having opposing polarity which accumulate in the substrate 25. The accumulated opposing electrostatic charge results in an attractive electrostatic force that electrostatically holds the substrate 25 to the chuck 102.

The support 75 is electrically biased with respect to the grounded walls of the process chamber 30 by the second voltage supply 114. Capacitive coupling between the support 75 and the grounded walls of the process chamber 30 generates an electric field for forming a plasma from the process gas. The plasma is attracted to the substrate 25 due to the electric field between the support 75 and the grounded walls of the process chamber 30. The conductor element 100 is in electrical contact with the support 75, and thus, electrically biased with respect to the walls of the process chamber 30. The electric field emanating from the conductor element 100 causes plasma ions to be attracted to, and impinge upon, the plasma focusing surface 95 of the dielectric barrier 92 to remove deposits formed thereon. The step of charging the conductor element 100 is performed before forming the plasma, charging of the conductor element 100 can be performed before, after, or during introduction of the process gas, or formation of the plasma, in the process chamber 30.

The apparatus 20 described herein can be used to deposit material on the substrate 25 such as by chemical vapor deposition, etch material from the substrate 25, or clean contaminant deposits deposited on the substrate 25, chamber walls and processing components. Chemical vapor deposition (CVD) processes that can be performed in the apparatus 20 to deposit coatings on the substrate 25, are generally described in Chapter 9, VLSI Technology, 2nd Ed., Ed. by Sze, McGraw-Hill Publishing Co., New York, which is incorporated herein by this reference. Typical chemical vapor deposition (CVD) processes for depositing $SiO_2$ on a substrate, use process gases such as (i) silicon source gas for example $SiH_4$ or $SiCl_2H_2$, and an oxygen source gas such as $CO_2$ and $H_2$, or $N_2O$; or (ii) a single gas containing both silicon and oxygen such as $Si(OC_2H_5)_4$. CVD processes for depositing $Si_3N_4$ typically use gases such as $SiH_4$ and $NH_3$ or $N_2$. Other conventional CVD process gases include $NH_3$, $AsH_3$, $B_2H_6$, $KCl$, $PH_3$ and $SiH_4$. The apparatus 20 can also be used for plasma etching processes as generally described in *VLSI Technology, Second Edition*, Chapter 5, by S. M. Sze, McGraw-Hill Publishing Company (1988), which is incorporated herein by reference. Typical metal interconnect etching processes use process gases such as $BCl_3$, $Cl_2$, $SF_6$, $CF_4$, $CFCl_3$, $CF_2Cl_2$, $CF_3Cl$, $CHF_3$ and $C_2ClF_5$. Resist etching processes typically use oxygen gas to etch the polymeric resist on the substrate. The various components in the process chamber 30, and the chamber itself, can be made from a variety of materials including metals, ceramics, glasses, polymers and composite materials, using conventional machining and molding methods. Preferred metals that are used to fabricate the process chamber 30 and components include aluminum, anodized aluminum, "HAYNES 242," "Al-6061," "SS 354," "SS 316," and INCONEL.

Although the present invention has been described in considerable detail with regard to the preferred versions thereof, other versions are possible. For example, the conductor element can form an integral portion of the wall of the process chamber, or a portion of the support holding the substrate. Therefore, the appended claims should not be limited to the descriptions of the preferred versions contained herein.

What is claimed is:

1. A process chamber for processing a substrate in a plasma, the process chamber comprising:

(a) a support adapted to support the substrate;

(b) a gas distributor adapted to introduce process gas in the chamber;

(c) a plasma generator adapted to form a plasma from the process gas; and (d) a composite focus ring around the substrate, the composite focus ring comprising a dielectric having a focusing surface for directing the plasma of the process gas toward the substrate, the dielectric substantially enclosing an electrical conductor element that is electrically chargeable to attract plasma species in the plasma toward the focusing surface of the dielectric thereby reducing the formation of deposits on the focusing surface during processing of the substrate.

2. The process chamber of claim 1 wherein the dielectric extends substantially continuously around the substrate.

3. The process chamber of claim 1 wherein the electrical conductor element is electrically connected to an electrically conducting portion of the support so that an electrical charge applied to the support is conducted to the electrical conductor element.

4. The process chamber of claim 1 wherein the dielectric comprises a resistivity that is sufficiently low to allow the charge applied to the electrical conductor element to electrically couple to the plasma through the dielectric and a resistivity sufficiently high to prevent an electrical discharge between the plasma and the electrical conductor element.

5. The process chamber of claim 4 wherein the dielectric comprises a collar.

6. The process chamber of claim 5 wherein the electrical conductor element comprises a ring sized to fit within the collar.

7. The process chamber of claim 4 wherein the dielectric comprises a resistivity of from about $1\times10^{11}$ Ωcm to about $1\times10^{20}$ Ωcm.

8. The apparatus of claim 1 wherein the plasma generator comprises a first electrode above the substrate and a second electrode below the substrate, the first and second electrodes being electrically biased relative to one another to sustain the plasma in the chamber, and wherein the electrical conductor element is electrically connected to the second electrode.

9. A chamber for processing a substrate, the chamber comprising:

(a) a support adapted to support the substrate;

(b) a gas distributor adapted to introduce process gas in the chamber;

(c) a plasma generator adapted to form a plasma from the process gas; and (d) a dielectric around the substrate, the dielectric having a surface adapted to direct the plasma of the process gas toward the substrate, and the dielectric substantially enclosing an electrical conductor that is adapted to be electrically charged.

10. The chamber of claim 9 wherein the dielectric enclosing the electrical conductor comprises a thickness that is sufficiently thin to allow the charged electrical conductor to attract plasma species in the plasma of the process gas toward the surface of the dielectric, whereby during processing of the substrate the formation of deposits on the surface of the dielectric is reduced.

11. The chamber of claim 9 wherein the dielectric extends substantially continuously around the substrate.

12. The chamber of claim 9 wherein the electrical conductor is electrically connected to an electrically conducting portion of the support so that an electrical charge applied to the support is conducted to the electrical conductor.

13. The chamber of claim 9 wherein the dielectric comprises a resistivity that is sufficiently low to allow a charge applied to the electrical conductor to electrically couple to the plasma through the dielectric and a resistivity that is sufficiently high to prevent an electrical discharge between the plasma and the electrical conductor.

14. The chamber of claim 9 wherein the dielectric comprises a resistivity of from about $1\times10^{11}$ Ωcm to about $1\times10^{20}$ Ωcm.

15. The chamber of claim 9 wherein the dielectric comprises a collar.

16. The chamber of claim 15 wherein the collar is U-shaped.

17. The chamber of claim 16 wherein the electrical conductor comprises a ring sized to fit within the collar.

* * * * *